US010195678B2

(12) United States Patent
Shimamura et al.

(10) Patent No.: US 10,195,678 B2
(45) Date of Patent: Feb. 5, 2019

(54) SUBSTRATE CUTTING DEVICE AND SUBSTRATE CUTTING METHOD (71) Applicant: SHODA TECHTRON CORP., Shizuoka (JP)

(72) Inventors: Tetsuya Shimamura, Shizuoka (JP); Kazuhiro Nakiri, Shizuoka (JP)

(73) Assignee: SHODA TECHTRON CORP., Shizuoka (JP)

( * ) Notice: Subject to any disclaimer, the term of this patent is extended or adjusted under 35 U.S.C. 154(b) by 0 days.

(21) Appl. No.: 15/543,836

(22) PCT Filed: Nov. 26, 2015

(86) PCT No.: PCT/JP2015/083190
§ 371 (c)(1),
(2) Date: Jul. 14, 2017

(87) PCT Pub. No.: WO2016/114014
PCT Pub. Date: Jul. 21, 2016

(65) Prior Publication Data
US 2018/0009046 A1   Jan. 11, 2018

(30) Foreign Application Priority Data
Jan. 16, 2015 (JP) .................. 2015-006405

(51) Int. Cl.
B23D 45/10 (2006.01)
B23D 59/00 (2006.01)
(Continued)

(52) U.S. Cl.
CPC .......... B23D 45/105 (2013.01); B23D 47/12 (2013.01); B23D 59/001 (2013.01); B28D 1/048 (2013.01);
(Continued)

(58) Field of Classification Search
CPC .... B23D 45/105; B28D 1/048; H05K 3/0044; H05K 2203/0228
(Continued)

(56) References Cited

U.S. PATENT DOCUMENTS 3,347,289 A * 10/1967 Zizka .................. B23D 45/105
144/162.1
4,985,982 A    1/1991 Gunter
(Continued)

FOREIGN PATENT DOCUMENTS

JP    01153213    6/1989
JP    02109630    4/1990
(Continued)

OTHER PUBLICATIONS

International Search Report dated Jan. 12, 2016 filed in PCT/JP2015/083190.
(Continued)

Primary Examiner — Ghassem Alie
(74) Attorney, Agent, or Firm — Rankin, Hill & Clark LLP (57) ABSTRACT A substrate cutting device includes: a first cutter including a plurality of first rotary blades; a second cutter including a plurality of second rotary blades; a first rotation drive unit for rotationally driving the first cutter; a second rotation drive unit for rotationally driving the second cutter; a cutter support unit; and a phase adjustment unit. The cutter support unit supports the first cutter and the second cutter such that the first and second cutters are radially opposed to each other so that rotation axes thereof are parallel to each other. The phase adjustment unit adjusts a phase of at least one of the first cutter and the second cutter such that each of the second rotary blades is located between two adjacent first rotary
(Continued)

blades in an opposing area in which the first cutter and the second cutter are opposed to each other.

6 Claims, 6 Drawing Sheets

(51) Int. Cl.
  *B28D 1/04* (2006.01)
  *H05K 3/00* (2006.01)
  *B23D 47/12* (2006.01)
(52) U.S. Cl.
  CPC ... *H05K 3/0052* (2013.01); *H05K 2203/0228* (2013.01); *H05K 2203/1572* (2013.01)
(58) Field of Classification Search
  USPC .................................................. 83/826, 495
  See application file for complete search history.

(56) References Cited

U.S. PATENT DOCUMENTS

| | | |
|---|---|---|
| 2004/0149095 A1 | 8/2004 | Miyatake |
| 2008/0028902 A1* | 2/2008 | Baggot .................. B26D 1/626 83/13 |
| 2013/0118328 A1 | 5/2013 | Salamone |

FOREIGN PATENT DOCUMENTS

| | | |
|---|---|---|
| JP | 7100790 A2 | 4/1995 |
| JP | 2012086353 A2 | 5/2012 |

OTHER PUBLICATIONS

Chinese Office Action dated Sep. 3, 2018 for the Chinese patent application No. 201580062078.9.

* cited by examiner

SUBSTRATE CUTTING DEVICE AND SUBSTRATE CUTTING METHOD

TECHNICAL FIELD

The present invention relates to a substrate cutting device and a substrate cutting method for cutting a substrate from one surface and the other surface of the substrate.

BACKGROUND ART

Heretofore, the following method is known as a method for manufacturing a substrate of an electric device and the like. Specifically, a plurality of substrates are collectively built in one substrate. Dividing grooves are formed from front and back surfaces between unit substrates in the substrate. The substrate is divided into a plurality of unit substrates by the dividing grooves. Patent Literature 1 discloses an example of a dividing groove forming device used for such a substrate manufacturing method. This dividing groove forming method includes two cutters each including a plurality of rotary blades.

CITATION LIST

Patent Literature

Patent Literature 1: Japanese Unexamined Patent Application Publication No. 2012-86353

In the dividing groove forming device disclosed in Patent Literature 1, the positional relationship between the rotary blades of the two cutters is not taken into consideration. Accordingly, there is a possibility that, if the two cutters are located closer to each other from a direction perpendicular to the substrate, the rotary blades may interfere with each other. Therefore, it has been difficult to completely cut the substrate by the dividing groove forming device. In other words, the dividing groove forming device cannot be used for replacing the substrate cutting device.

Figure 6:
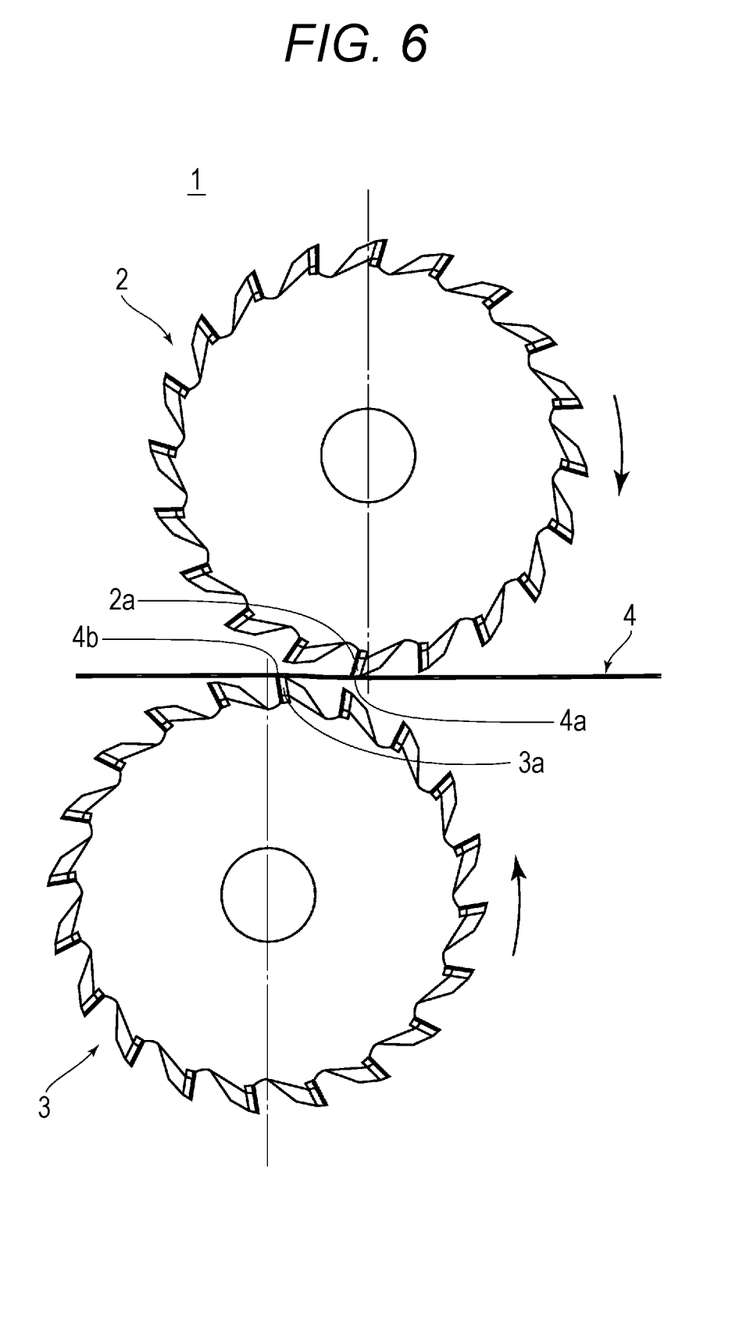
FIG. 6 is a front view illustrating a structure of a substrate cutting device of related art.

FIG. 6 is a front view illustrating a structure of a substrate cutting device 1 of the related art. The substrate cutting device 1 illustrated in FIG. 6 includes a first cutter 2 including a plurality of first rotary blades 2a, and a second cutter 3 including a plurality of second rotary blades 3a. The first cutter 2 and the second cutter 3 are disposed so as to be spaced apart from each other in a direction in which a substrate 4 is cut. This structure prevents the first rotary blades 2a and the second rotary blades 3a from interfering with each other.

However, in the substrate cutting device 1, a first portion 4a of the substrate 4 with which the first rotary blades 2a comes into contact is pressed down and warped to a large extent, and a second portion 4b of the substrate 4 with which the second rotary blades 3a comes into contact is pressed upward and warped to a large extent. This causes a problem that the substrate cannot be cut clearly. Further, when the substrate 4 having a large thickness is cut, a warp of the substrate 4 increases due to a lack of rigidity. Accordingly, there is a problem that it is difficult to cut the substrate 4. Further, there is a problem that the device structure including the first cutter 2 and the second cutter 3 is increased in size in the direction in which the substrate 4 is cut.

SUMMARY OF INVENTION

The present invention has been made to solve the above-mentioned problems. An object of the present invention is to provide a substrate cutting device and a substrate cutting method which are capable of suppressing a warp of a substrate at the time of cutting the substrate and are capable of preventing an increase in the size of the device structure.

In order to achieve the above-described object, a feature of a substrate cutting device according to the present invention is that the substrate cutting device is for cutting a substrate from one surface and the other surface of the substrate, and the substrate cutting device includes: a first cutter for cutting the substrate from the one surface, the first cutter including a plurality of first rotary blades; a second cutter for cutting the substrate from the other surface, the second cutter including a plurality of second rotary blades; a first rotation drive unit for rotationally driving the first cutter; a second rotation drive unit for rotationally driving the second cutter; a cutter support unit for supporting the first cutter and the second cutter in such a manner that the first cutter and the second cutter are radially opposed to each other so that rotation axes of the first cutter and the second cutter are parallel to each other; and a phase adjustment unit for adjusting a phase of at least one of the first cutter and the second cutter in such a manner that each of the second rotary blades is located between two adjacent first rotary blades in an opposing area in which the first cutter and the second cutter are opposed to each other.

In this structure, in the opposing area in which the first cutter and the second cutter are opposed to each other, each second rotary blade is located between two adjacent first rotary blades. This structure can prevent the first rotary blades and the second rotary blades from being greatly spaced apart from each other in the direction in which the substrate is cut. Accordingly, when the substrate is cut by one of the first rotary blades and the second rotary blades, a warp of the substrate can be suppressed by the other one of the first rotary blades and the second rotary blades. Further, the first cutter and the second cutter are supported in such a manner that the first and second cutters are radially opposed to each other so that the rotation axes of the first and second cutters are parallel to each other. Consequently, an increase in the size of the device structure in the direction in which the substrate is cut can be prevented.

Another feature of the present invention is configured as follows. The substrate cutting device further includes an X-direction drive unit for causing the first cutter and the second cutter to move relatively to the substrate in a direction in which the substrate is cut.

In this structure, the X-direction drive unit can cause the first cutter and the second cutter to move relatively to the substrate. Accordingly, the operation for cutting the substrate can be performed smoothly.

Another feature of the present invention is configured as follows. The first rotation drive unit includes a first motor, the second rotation drive unit includes a second motor, the phase adjustment unit includes a control unit for controlling at least one of the first motor and the second motor, and the control unit controls at least one of the first motor and the second motor in such a manner that each of the second rotary blades is located between two adjacent first rotary blades in the opposing area.

In this structure, at least one of the first motor and the second motor is controlled by the control unit. Accordingly, the phase of at least one of the first cutter and the second cutter can be adjusted rapidly and accurately.

Another feature of the present invention is configured as follows. The plurality of first rotary blades and the plurality of second rotary blades are the same in number and the plurality of first rotary blades and the plurality of second rotary blades are provided at the same pitch angle, the phase adjustment unit includes a phase detection unit for detecting phases of the first cutter and the second cutter, and the control unit controls at least one of the first motor and the second motor in such a manner that a difference between the phase of the first cutter and the phase of the second cutter is equal to a value obtained by subtracting ½ of the pitch angle from an integral multiple of the pitch angle.

In this structure, each second rotary blade can be easily located between two adjacent first rotary blades only by controlling at least one of the first motor and the second motor in such a manner that the phase difference is equal to the value obtained by subtracting ½ of the pitch angle from an integral multiple of the pitch angle.

In order to achieve the above-described object, a feature of a substrate cutting method according to the present invention is that the substrate cutting method is for cutting a substrate from one surface and the other surface of the substrate, and the substrate cutting method includes: (a) arranging a first cutter for cutting the substrate from the one surface and a second cutter for cutting the substrate from the other surface in such a manner that the first cutter and the second cutter are radially opposed to each other so that rotation axes of the first cutter and the second cutter are parallel to each other, the first cutter including a plurality of first rotary blades, the second cutter including a plurality of second rotary blades; (b) rotating the first cutter and the second cutter in such a manner that each of the second rotary blades is located between two adjacent first rotary blades in an opposing area in which the first cutter and the second cutter are opposed to each other; and (c) cutting the substrate by causing the first cutter and the second cutter to move relatively to the substrate in a direction in which the substrate is cut.

In this method, the first rotary blades and the second rotary blades can be prevented from being greatly spaced apart from each other in the direction in which the substrate is cut, so that a warp of the substrate at the time of cutting the substrate can be suppressed. Further, an increase in the size of the device structure in the direction in which the substrate is cut can be prevented.

DESCRIPTION OF EMBODIMENTS

Embodiments of a substrate cutting device and a substrate cutting method according to the present invention will be described below with reference to the drawings.
[Substrate Cutting Device]

Figure 1:
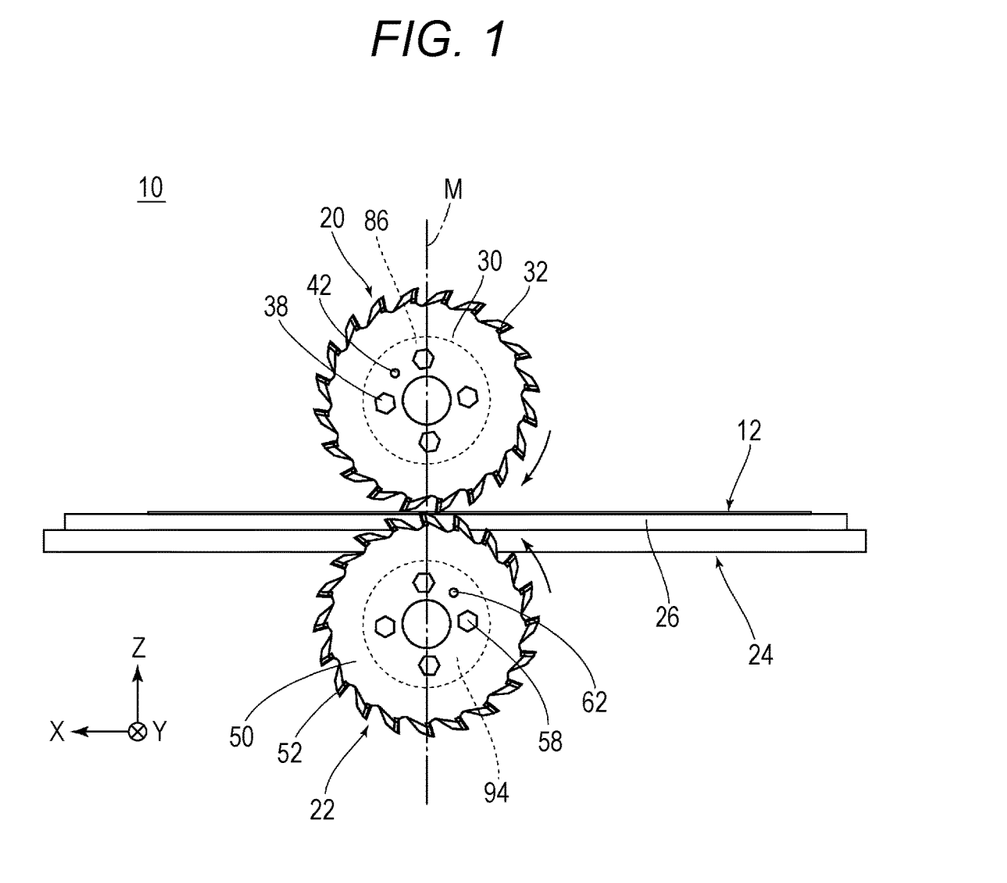
FIG. 1 is a front view illustrating a structure of a substrate cutting device according to one embodiment of the present invention.
Figure 2:
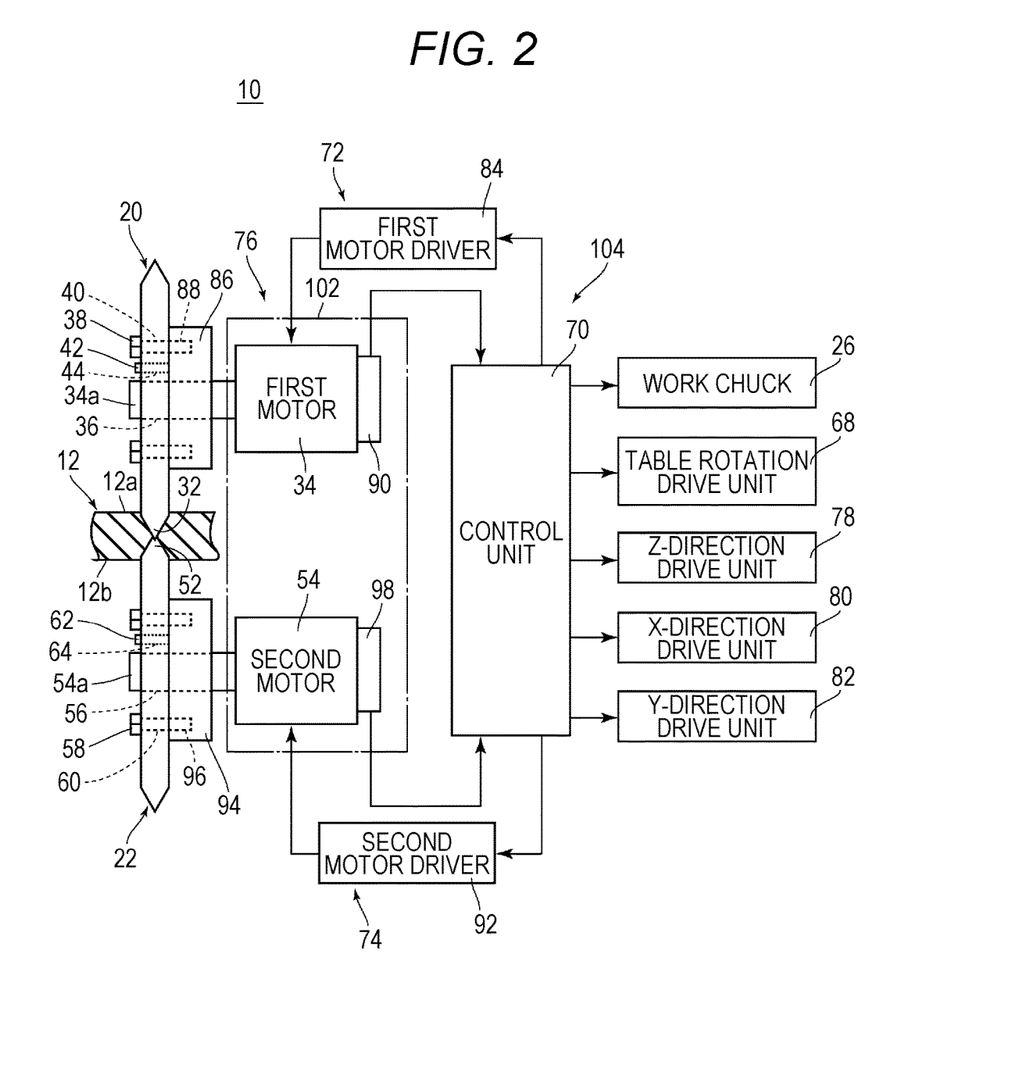
FIG. 2 is a block diagram illustrating the structure of the substrate cutting device according to one embodiment of the present invention.
Figure 3:
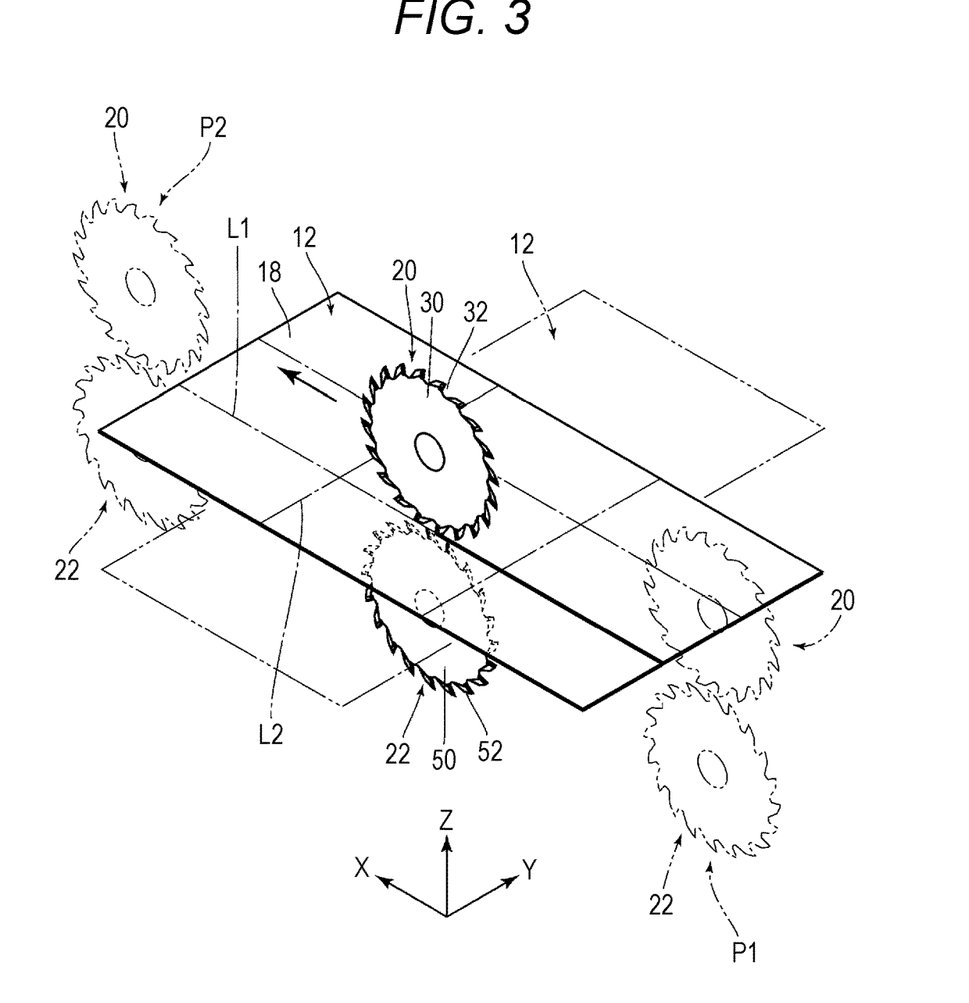
FIG. 3 is a perspective view illustrating a process for cutting a substrate.

FIG. 1 is a front view illustrating a structure of a substrate cutting device 10 according to one embodiment of the present invention. FIG. 2 is a block diagram illustrating the structure of the substrate cutting device 10. FIG. 3 is a perspective view illustrating a process for cutting a substrate 12. As illustrated in FIG. 3, a direction in which the substrate 12 is cut is hereinafter referred to as an X-direction; a vertical direction is hereinafter referred to as a Z-direction; and a direction perpendicular to each of the X-direction and the Z-direction is hereinafter referred to as a Y-direction.

As illustrated in FIG. 2, the substrate cutting device 10 is a device for completely cutting the substrate 12 from one surface 12a and the other surface 12b of the substrate 12. As illustrated in FIG. 3, the substrate 12 used in this embodiment is a collective substrate which has a small thickness (a thickness of about 0.3 to 0.4 mm) and in which a plurality of (nine in this embodiment) unit substrates 18 that are used for an electric device (e.g., a cellular phone) and the like are built. Note that the thickness of the substrate 12 is not limited to that of this embodiment.

As illustrated in FIG. 1, the substrate cutting device 10 includes a disk-shaped first cutter 20, a disk-shaped second cutter 22, a rotating table 24, and a work chuck 26.

As illustrated in FIG. 1, the first cutter 20 includes a disk-shaped base metal 30 and a plurality of (20 in this embodiment) first rotary blades 32 which are provided at an outer periphery of the base metal 30. As illustrated in FIG. 2, a through-hole 36 through which a rotating shaft 34a of a first motor 34, which is described later, is inserted is formed at a central part of the base metal 30. In a part of the base metal 30 in the vicinity of the through-hole 36, a plurality of (four in this embodiment) through-holes 40 through which bolts 38 are respectively inserted are formed. In a part of the base metal 30 in the vicinity of the through-holes 40, at least one (one in this embodiment) through-hole 44 through which a positioning pin 42 is inserted is formed.

The first rotary blades 32 illustrated in FIG. 1 are cutting blades for cutting off the substrate 12 by cutting the substrate 12. The plurality of first rotary blades 32 are provided at regular intervals (at angular intervals of 18 degrees in this embodiment) at the outer periphery of the base metal 30. In this embodiment, the first cutter 20 is structured to rotate clockwise in a front view, and each first rotary blade 32 is provided so as to face forward in the clockwise direction.

As illustrated in FIG. 1, the second cutter 22 includes a disk-shaped base metal 50 and a plurality of (20 in this embodiment) second rotary blades 52 which are provided at an outer periphery of the base metal 50. As illustrated in FIG. 2, a through-hole 56 through which a rotating shaft 54a of a second motor 54, which is describer later, is inserted is formed at a central part of the base metal 50. In a part of the base metal 50 in the vicinity of the through-hole 56, a plurality of (four in this embodiment) through-holes 60 through which bolts 58 are respectively inserted are formed. In a part of the base metal 50 in the vicinity of the through-holes 60, at least one (one in this embodiment) through-hole 64 through which a positioning pin 62 is inserted is formed.

The second rotary blades 52 illustrated in FIG. 1 are cutting blades for cutting off the substrate 12 by cutting the substrate 12. The plurality of second rotary blades 52 are provided at regular intervals (at angular intervals of 18 degrees in this embodiment) at the outer periphery of the base metal 50. In this embodiment, the second cutter 22 is structured to rotate counterclockwise in a front view, and each second rotary blade 52 is provided so as to face forward in the counterclockwise direction.

As illustrated in FIG. 1, the rotating table 24 supports the substrate 12 in the process for cutting the substrate 12. The rotating table 24 is provided with a table rotation drive unit 68 (FIG. 2) for changing the direction of the rotating table between the X-direction and the Y-direction. Accordingly, even when the substrate 12 supported by the rotating table 24 is cut along cutting lines L1 and L2 (FIG. 3) which are perpendicular to each other, the first cutter 20 and the second cutter 22 may be caused to move only in one of the X-direction and the Y-direction (only in the X-direction in this embodiment). The table rotation drive unit 68 includes a servo motor (not shown). As illustrated in FIG. 2, the table rotation drive unit 68 is electrically connected to the control unit 70. The servo motor (not shown) and the like of the table rotation drive unit 68 are controlled based on a control signal supplied from the control unit 70.

As illustrated in FIG. 1, the work chuck 26 is used to fix the substrate 12 to the rotating table 24. The work chuck 26 of this embodiment is a vacuum chuck that is structured to be able to adsorb the substrate 12 with a negative pressure. The work chuck 26 includes a solenoid valve (not shown) for switching an adsorbed state and an adsorption released state. As illustrated in FIG. 2, the work chuck 26 is electrically connected to the control unit 70. The solenoid valve (not shown) and the like of the work chuck 26 are controlled based on a control signal supplied from the control unit 70.

As illustrated in FIG. 2, the substrate cutting device 10 includes a first rotation drive unit 72, a second rotation drive unit 74, a cutter support unit 76, an X-direction drive unit 80, a Y-direction drive unit 82, and a phase adjustment unit 104.

As illustrated in FIG. 2, the first rotation drive unit 72 is a unit for rotationally driving the first cutter 20, and includes the first motor 34 and a first motor driver 84. The first motor 34 of this embodiment is a servo motor and is structured to be rotationally driven at a rotational speed of 8000 to 10000 rev/min. The rotating shaft 34a of the first motor 34 is provided with a flange 86 to which the first cutter 20 is fixed. The flange 86 is provided with screw holes 88 and the positioning pin 42. The bolts 38 inserted through the through-hole 40 of the first cutter 20 are threadedly engaged with the screw holes 88, respectively. The positioning pin 42 is inserted through the through-hole 44 of the first cutter 20. In a state where the first cutter 20 is fixed to the flange 86, the rotating shaft 34a of the first motor 34 serves as the rotating shaft of the first cutter 20.

As illustrated in FIG. 2, the first motor 34 is provided with a first phase detection part 90 for detecting the phase of the rotating shaft 34a (i.e., the phase of the first cutter 20). The first phase detection part 90 of this embodiment includes a rotary encoder. The first phase detection part 90 and the control unit 70 are electrically connected to each other.

The first motor driver 84 illustrated in FIG. 2 supplies a drive current to the first motor 34. The first motor driver 84 is electrically connected to the control unit 70. When the control signal is supplied to the first motor driver 84 from the control unit 70, the first motor driver 84 supplies a drive current corresponding to the control signal to the first motor 34.

As illustrated in FIG. 2, the second rotation drive unit 74 is a unit for rotationally driving the second cutter 22 and includes the second motor 54 and a second motor driver 92. The second motor 54 of this embodiment is a servo motor and is structured to be rotationally driven at a rotational speed of 8000 to 10000 rev/min. The rotating shaft 54a of the second motor 54 is provided with a flange 94 to which the second cutter 22 is fixed. The flange 94 is provided with screw holes 96 and the positioning pin 62. The bolts 58 inserted through the through-holes 60 of the second cutter 22 are threadedly engaged with the screw holes 96, respectively. The positioning pin 62 is inserted through the through-hole 64 of the second cutter 22. In a state where the second cutter 22 is fixed to the flange 94, the rotating shaft 54a of the second motor 54 serves as the rotating shaft of the second cutter 22.

As illustrated in FIG. 2, the second motor 54 is provided with a second phase detection part 98 for detecting the phase of the rotating shaft 54a (i.e., the phase of the second cutter 22). The second phase detection part 98 of this embodiment includes a rotary encoder. The second phase detection part 98 and the control unit 70 are electrically connected to each other.

The second motor driver 92 illustrated in FIG. 2 supplies a drive current to the second motor 54. The second motor driver 92 is electrically connected to the control unit 70. When the control signal is supplied to the second motor driver 92 from the control unit 70, the second motor driver 92 supplies a drive current corresponding to the control signal to the second motor 54.

As illustrated in FIG. 2, the cutter support unit 76 is a unit for supporting the first cutter 20 and the second cutter 22 in such a manner that the first cutter 20 and the second cutter 22 are radially opposed to each other so that rotation axes of the first cutter 20 and the second cutter 22 are parallel to each other. The cutter support unit 76 of this embodiment includes: the first motor 34 to which the first cutter 20 is attached; the second motor 54 to which the second cutter 22 is attached; a Z-direction drive unit 78 for supporting the first motor 34 and the second motor 54; and a fulcrum 102 for supporting the Z-direction drive unit 78. The Z-direction drive unit 78 is a unit for causing the first motor 34 and the second motor 54 to move in the Z-direction, and includes a linear guide and a servo motor (not shown). The Z-direction drive unit 78 is electrically connected to the control unit 70. The servo motor (not shown) and the like of the Z-direction drive unit 78 are controlled based on the control signal supplied from the control unit 70.

The X-direction drive unit 80 illustrated in FIG. 2 is a unit for causing the first cutter 20 and the second cutter 22 to move in the X-direction together with the cutter support unit 76. The Y-direction drive unit 82 illustrated in FIG. 2 is a unit for causing the first cutter 20 and the second cutter 22 to move in the Y-direction together with the cutter support unit 76. Each of the X-direction drive unit 80 and the Y-direction drive unit 82 includes a linear guide and a servo motor (not shown). The X-direction drive unit 80 and the Y-direction drive unit 82 are electrically connected to the control unit 70. The servo motors (not shown) and the like of the X-direction drive unit 80 and the Y-direction drive unit 82 are controlled based on the control signal supplied from the control unit 70.

Figure 4:
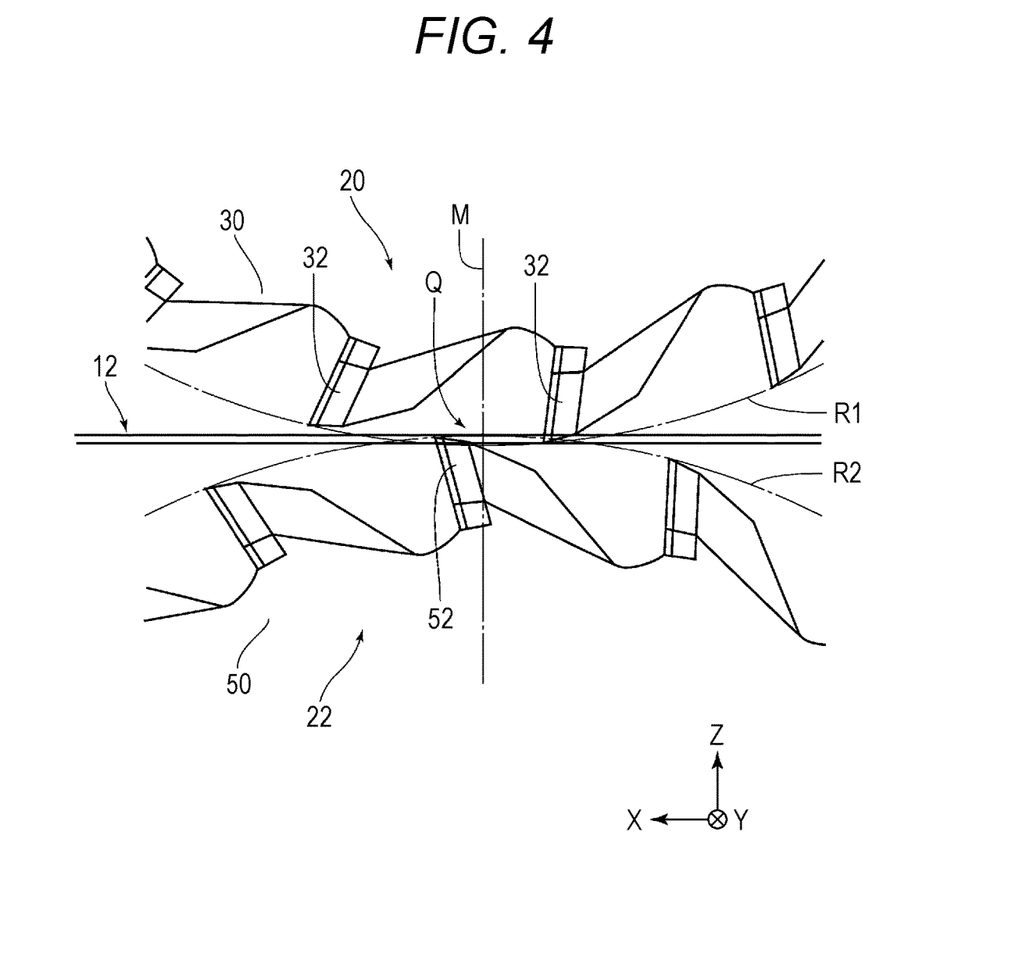
FIG. 4 is an enlarged front view illustrating a state where a second rotary blade is disposed between first rotary blades.

FIG. 4 is an enlarged front view illustrating a state where the second rotary blade 52 is disposed between the first rotary blades 32. The phase adjustment unit 104 illustrated in FIG. 2 is a unit for adjusting the phase of at least one of the first cutter 20 and the second cutter 22 in such a manner that the second rotary blade 52 is located between two adjacent first rotary blades 32 in an opposing area Q (FIG. 4) in which the first cutter 20 and the second cutter 22 are opposed to each other. As illustrated in FIG. 4, when a circumscribed circle R1 that circumscribes the plurality of first rotary blades 32 and a circumscribed circle R2 that circumscribes the plurality of second rotary blades 52 are assumed, the circumscribed circle R1 and the circumscribed circle R2 intersect with each other in the opposing area Q.

As illustrated in FIG. 2, the phase adjustment unit 104 of this embodiment includes the first motor 34, a first phase detection unit 90, a first motor driver 84, the second motor 54, a second phase detection unit 98, a second motor driver 92, and the control unit 70. The control unit 70 of the phase adjustment unit 104 controls at least one of the first motor 34 and the second motor 54 for phase adjustment. The control unit 70 includes a central processing unit (CPU) that executes various arithmetic processes, and storage devices (ROM, RAM) for storing programs and data.

A reference line M illustrated in FIG. 4 is a virtual line that is perpendicular to the substrate 12 and passes through the rotation center of the first cutter 20 and the rotation center of the second cutter 22. When the first phase detection unit 90 and the second phase detection unit 98 output a signal representing an origin position, two adjacent first rotary blades 32 are located on both sides of the reference line M in the X-direction and each second rotary blade 52 is disposed between the two first rotary blades 32 in the opposing area Q.

In this embodiment, the plurality of first rotary blades 32 and the plurality of second rotary blades 52 are the same in number and the plurality of first rotary blades 32 and the plurality of second rotary blades 52 are provided at the same pitch angle. Therefore, when the phase difference between the first cutter 20 and the second cutter 22 is equal to an integral multiple of the pitch angle (18 degrees in this embodiment), the first rotary blades 32 and the second rotary blades 52 are opposed to each other in the opposing area Q. Accordingly, in order to prevent the first rotary blade 32 and the second rotary blades 52 from interfering with each other, the control unit 70 illustrated in FIG. 2 controls at least one of the first motor 34 and the second motor 54 in such a manner that the phase difference is equal to a value obtained by subtracting ½ of the pitch angle (nine degrees in this embodiment) from the integral multiple of the pitch angle (18 degrees in this embodiment).

[Substrate Cutting Method]

When the substrate 12 is cut along the cutting lines L1 and L2 illustrated in FIG. 3, the substrate 12 is first placed on the rotating table 24 illustrated in FIG. 1, and the substrate 12 is fixed by the work chuck 26. Subsequently, the substrate 12 is cut along each cutting line L1 (FIG. 3) by rotationally driving the first cutter 20 and the second cutter 22 to move in the X-direction and the Y-direction.

When the operation for cutting the substrate 12 along a plurality of cutting lines L1 illustrated in FIG. 3 is completed, the rotating table 24 illustrated in FIG. 1 is rotated to change the direction in which each cutting line L2 (FIG. 3) of the substrate 12 extends, from the Y-direction to the X-direction. After that, the substrate 12 is cut along each cutting line L2 (FIG. 3) by moving the first cutter 20 and the second cutter 22 in the X-direction and the Y-direction. Note that an alternate long and two short dashes line illustrated in FIG. 3 indicates a state of the substrate 12 after the direction is changed.

A method for cutting the substrate 12 (substrate cutting method) along each of the cutting lines L1 and L2 will be described in detail below with reference to the flowchart of FIG. 5.

Figure 5:
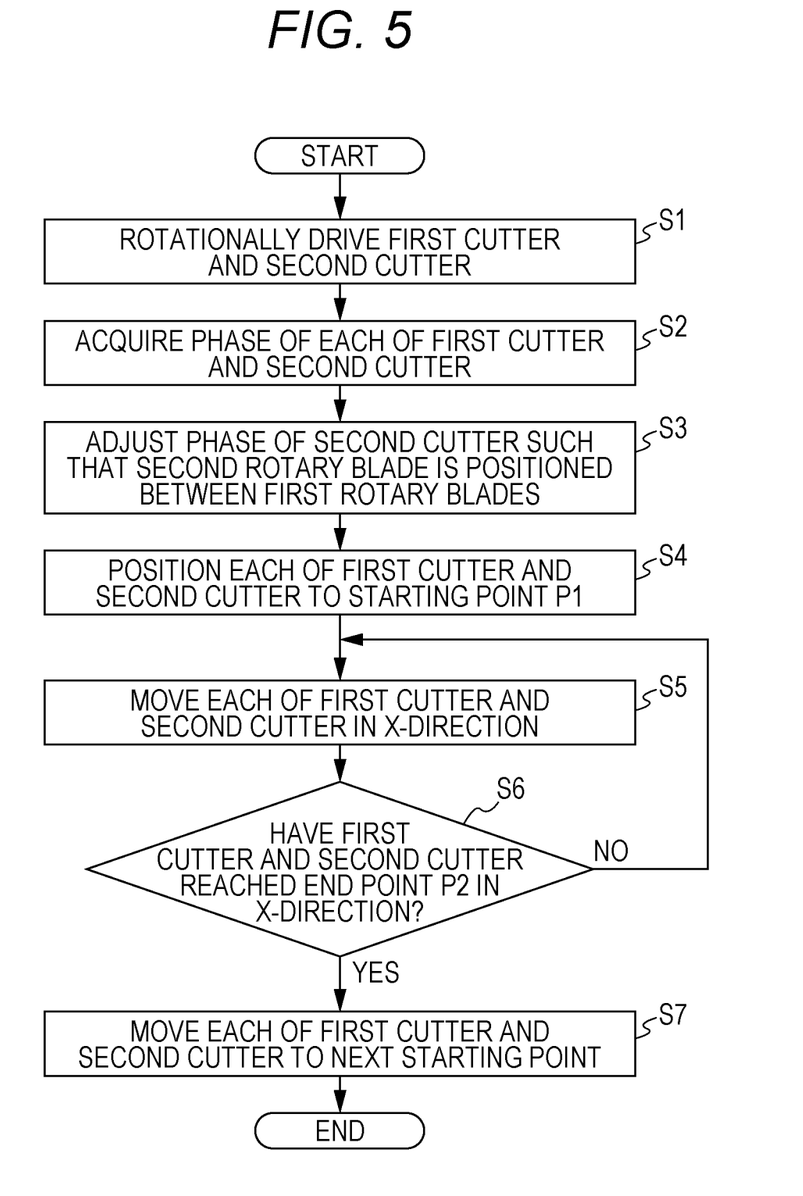
FIG. 5 is a flowchart illustrating each process of a substrate cutting method according to one embodiment of the present invention.

When the control unit 70 illustrated in FIG. 2 starts a substrate cutting program, the control unit 70 executes steps S1 to S7 illustrated in FIG. 5 in this order. First, in step S1, the control unit 70 controls the first motor 34 and the second motor 54 to rotationally drive the first cutter 20 and the second cutter 22. At this time, the Z-direction drive unit 78 causes the first cutter 20 and the second cutter 22 to be spaced apart from each other in the Z-direction.

When the first rotary blades 32 and the second rotary blades 52 are opposed to each other in the Z-direction in the opposing area Q illustrated in FIG. 4, the first rotary blades 32 and the second rotary blades 52 interfere with each other at the time of cutting the substrate 12. Therefore, the positions of the first rotary blades 32 and the second rotary blades 52 need to be shifted from each other in the X-direction. Accordingly, in steps S2 and S3, the control unit 70 of the phase adjustment unit 104 illustrated in FIG. 2 adjusts the phase of the second cutter 22 in such a manner that each second rotary blade 52 is located between two adjacent first rotary blades 32.

Specifically, in step S2, the control unit 70 acquires the phases of the first cutter 20 and the second cutter 22 that are detected by the first phase detection unit 90 and the second phase detection unit 98 (FIG. 2), respectively. In step S3, the control unit 70 adjusts the phase of the second cutter 22 in such a manner that each second rotary blade 52 is located between two adjacent first rotary blades 32 in the opposing area Q (FIG. 4). More specifically, the control unit 70 controls the second motor 54 in such a manner that the phase difference is equal to a value obtained by subtracting ½ of the pitch angle (nine degrees in this embodiment) from an integral multiple of the pitch angle (18 degrees in this embodiment). The control unit 70 continuously performs the processes of steps S2 and S3 until the substrate cutting program is completed.

Note that in step S3, the control unit 70 may control the first motor 34 (FIG. 2) to adjust the phase of the first cutter 20. Further, the control unit 70 may adjust the phases of the first cutter 20 and the second cutter 22 by controlling both the first motor 34 and the second motor 54 (FIG. 2). The value to be subtracted from the integral multiple of the pitch angle is not limited to ½ of the pitch angle and may be changed as appropriate within a range in which the first rotary blade 32 and the second rotary blades 52 do not interfere with each other.

In step S4, the control unit 70 controls the X-direction drive unit 80, the Y-direction drive unit 82, and the Z-direction drive unit 78 to thereby position the first cutter 20 and the second cutter 22 at a starting point P1 illustrated in FIG. 3. The control unit 70 controls the X-direction drive unit 80, the Y-direction drive unit 82, and the Z-direction drive unit 78 to thereby position the first cutter 20 and the second cutter 22 at a starting point P1 illustrated in FIG. 3. At this time, the Z-direction drive unit 78 moves the first cutter 20 and the second cutter 22 in directions approaching each other. In step S5, the control unit 70 controls the X-direction drive unit 80 to move the first cutter 20 and the second cutter 22 in the X-direction, thereby cutting the substrate 12 in the X-direction.

In step S6, the control unit 70 determines whether or not the first cutter 20 and the second cutter 22 have reached an end point P2 (FIG. 3) in the X-direction. When the control unit 70 determines that the first and second cutters have not reached the end point, the control unit 70 continues the operation of step S5 (movement in the X-direction). When the control unit 70 determines that the first and second cutters have reached the end point, the control unit proceeds to step S7. Whether or not the first cutter 20 and the second cutter 22 have reached the end point P2 can be determined based on, for example, an output of a limit switch (not shown) that is pressed by the cutter support unit 76 (FIG. 2).

In step S7, the control unit 70 controls the X-direction drive unit 80, the Y-direction drive unit 82, and the Z-direction drive unit 78 (FIG. 2), thereby moving the first cutter 20 and the second cutter 22 to the next starting point. Thus, the process for cutting the substrate 12 along one of the plurality of cutting lines L1 and the plurality of cutting lines L2 is finished.

Advantageous Effects of Embodiments

According to this embodiment, the following advantageous effects can be provided by the structure described above. That is, as illustrated in FIG. 4, in the opposing area Q in which the first cutter 20 and the second cutter 22 are opposed to each other, each second rotary blade 52 is located between two adjacent first rotary blades 32. This structure can prevent the first rotary blades 32 and the second rotary blades 52 from being greatly spaced apart from each other in the X-direction in which the substrate 12 is cut. Therefore, when the substrate 12 is cut by one of the first rotary blades 32 and the second rotary blades 52, a warp of the substrate 12 can be suppressed by the other one of the first rotary blades 32 and the second rotary blades 52. Further, an increase in the size of the device structure in the X-direction can be prevented.

The X-direction drive unit 80 illustrated in FIG. 2 can cause the first cutter 20 and the second cutter 22 to move relatively to the substrate 12. Accordingly, the operation for cutting the substrate 12 can be performed smoothly. Further, the first motor 34 and the second motor 54 are controlled by the control unit 70. Therefore, the phase of at least one of the first cutter 20 and the second cutter 22 can be adjusted rapidly and accurately.

As illustrated in FIG. 1, the plurality of first rotary blades 32 and the plurality of second rotary blades 52 are the same in number and the plurality of first rotary blades 32 and the plurality of second rotary blades 52 are provided at the same pitch angle. Accordingly, each second rotary blade 52 can be easily located between two adjacent first rotary blades 32 only by controlling at least one of the first motor 34 and the second motor 54 in such a manner that the phase difference is equal to a value obtained by subtracting ½ of the pitch angle from the integral multiple of the pitch angle.

Modified Examples

Note that the implementation of the present invention is not limited to the above embodiments and can be modified in various ways without departing from the scope of the present invention. For example, as illustrated in FIG. 3, in the above embodiments, the first cutter 20 and the second cutter 22 are moved in the X-direction relatively to the substrate 12. On the contrary, the substrate 12 may be moved (not shown) in the X-direction relatively to the first cutter 20 and the second cutter 22.

Further, as illustrated in FIG. 2, in the above embodiments, the phase adjustment unit 104 including the control unit 70 is used as a phase adjustment unit for adjusting the phase of at least one of the first cutter 20 and the second cutter 22. Alternatively, a mechanical phase adjustment unit (not shown) composed of a gear, a timing belt, or the like may be used.

DESCRIPTION OF REFERENCE SIGNS

10 Substrate cutting device
20 First cutter
22 Second cutter
32 First rotary blade
52 Second rotary blade
72 First rotation drive unit
74 Second rotation drive unit
76 Cutter support unit
104 Phase adjustment unit

The invention claimed is:

1. A substrate cutting device for cutting a substrate from one surface and the other surface of the substrate, the substrate cutting device comprising:
    a first cutter for cutting the substrate from the one surface, the first cutter including a plurality of first rotary blades;
    a second cutter for cutting the substrate from the other surface, the second cutter including a plurality of second rotary blades;
    a first rotation drive unit for rotationally driving the first cutter;
    a second rotation drive unit for rotationally driving the second cutter;
    a cutter support unit for supporting the first cutter and the second cutter in such a manner that the first cutter and the second cutter are radially opposed to each other so that rotation axes of the first cutter and the second cutter are parallel to each other; and
    a phase adjustment unit for adjusting a phase of at least one selected from a group consisting of the first cutter and the second cutter, in such a manner that each of the second rotary blades is located between two adjacent first rotary blades in an opposing area in which the first cutter and the second cutter are opposed to each other, wherein
    the first rotation drive unit includes a first motor,
    the second rotation drive unit includes a second motor,
    the phase adjustment unit includes a control unit for controlling at least one selected from a group consisting of the first motor and the second motor, and
    the control unit controls at least one selected from the group consisting of the first motor and the second motor, in such a manner that each of the second rotary blades is located between two adjacent first rotary blades in the opposing area.

2. The substrate cutting device according to claim 1, further comprising an X-direction drive unit for causing the first cutter and the second cutter to move relatively to the substrate in a direction in which the substrate is cut.

3. The substrate cutting device according to claim 2, wherein
    the plurality of first rotary blades and the plurality of second rotary blades are the same in number and the plurality of first rotary blades and the plurality of second rotary blades are provided at the same pitch angle,
    the phase adjustment unit includes a phase detection unit for detecting phases of the first cutter and the second cutter, and
    the control unit controls at least one selected from the group consisting of the first motor and the second motor, in such a manner that a difference between the phase of the first cutter and the phase of the second cutter is equal to a value obtained by subtracting ½ of the pitch angle from an integral multiple of the pitch angle.

4. The substrate cutting device according to claim 1, wherein the plurality of first rotary blades and the plurality of second rotary blades are the same in number and the plurality of first rotary blades and the plurality of second rotary blades are provided at the same pitch angle, the phase adjustment unit includes a phase detection unit for detecting phases of the first cutter and the second cutter, and the control unit controls at least one selected from the group consisting of the first motor and the second motor, in such a manner that a difference between the phase of the first cutter and the phase of the second cutter is equal to a value obtained by subtracting ½ of the pitch angle from an integral multiple of the pitch angle.

5. A substrate cutting method for cutting a substrate from one surface and the other surface of the substrate, the substrate cutting method comprising:

(a) arranging a first cutter for cutting the substrate from the one surface and a second cutter for cutting the substrate from the other surface in such a manner that the first cutter and the second cutter are radially opposed to each other so that rotation axes of the first cutter and the second cutter are parallel to each other, the first cutter including a plurality of first rotary blades, the second cutter including a plurality of second rotary blades;

(b) rotating the first cutter and the second cutter in such a manner that each of the second rotary blades is located between two adjacent first rotary blades in an opposing area in which the first cutter and the second cutter are opposed to each other; and (c) cutting the substrate by causing the first cutter and the second cutter to move relatively to the substrate in a direction in which the substrate is cut, wherein said (b) rotating the first cutter and the second cutter comprises controlling at least one selected from a group consisting of a first motor for rotating the first cutter and a second motor for rotating the second cutter, in such a manner that each of the second rotary blades is located between two adjacent first rotary blades in the opposing area.

6. The substrate cutting method according to claim 5, wherein the plurality of first rotary blades and the plurality of second rotary blades are the same in number and the plurality of first rotary blades and the plurality of second rotary blades are provided at the same pitch angle, said (b) rotating the first cutter and the second cutter further comprises:

detecting phases of the first cutter and the second cutter, and controlling at least one selected from the group consisting of the first motor and the second motor, in such a manner that a difference between the phase of the first cutter and the phase of the second cutter is equal to a value obtained by subtracting ½ of the pitch angle from an integral multiple of the pitch angle.

* * * * *